(12) United States Patent
Cyrusian

(10) Patent No.: US 6,480,064 B1
(45) Date of Patent: Nov. 12, 2002

(54) METHOD AND APPARATUS FOR AN EFFICIENT LOW VOLTAGE SWITCHABLE GM CELL

(75) Inventor: Sasan Cyrusian, Scotts Valley, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/865,863

(22) Filed: May 25, 2001

(51) Int. Cl.$^7$ ................................................. H03F 3/45
(52) U.S. Cl. ...................... 330/253; 330/254; 330/305
(58) Field of Search ................................. 330/253, 254, 330/305, 252

(56) References Cited

U.S. PATENT DOCUMENTS 5,384,501 A * 1/1995 Koyama et al. ............ 330/253
5,530,399 A * 6/1996 Chambers et al. .......... 330/252

OTHER PUBLICATIONS

"Synchronous Recording Channels—PRML & Beyond", rev. 5.61 14.E.18, 1999, published by Knowledge Tek, Inc., Broomfield, Colorado.
"PRML: Seagate Uses Space Age Technology" available on the Internet at http://www.seagate.com/support/kb/disc/prml.html, 2 pages, last accessed Apr. 9, 2001.
"Technologies—PRML" available on the Internet at http://www.idema.org/about/industry/ind_tech_prml.html, 1 page, last accessed Apr. 9, 2001.
"Reference Guide—Hard Disk Drives" available on the Internet at http://www.storagereview.com/guide2000/ref/hdd, 13 pages, last accessed Apr. 9, 2001.
"MR AND PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.
"A Tutorial on Convolutional Coding with Viterbi Decoding" available on the Internet at http://pw1.netcom.com/~chip.f/viterbi/tutorial.html, 10 pages, last accessed Apr. 9, 2001.

* cited by examiner

Primary Examiner—Michael B Shingleton
(74) Attorney, Agent, or Firm—Brinks Hofer Gilson & Lione

(57) ABSTRACT

A switching Gm cell allowing a wide transconductance range with a limited voltage range. The Gm cell includes a plurality of Gm setting devices, the operation of which is controlled by a Gm setting code. The Gm setting code is inputted into a switching circuit which turns on and off at least one of said Gm setting devices. Thus, coarse adjustments of the overall transconductance of the cell may be adjusted by changing the Gm setting code and fine adjustments may be made by utilizing the conventional method of adjusting a tuning voltage.

13 Claims, 11 Drawing Sheets

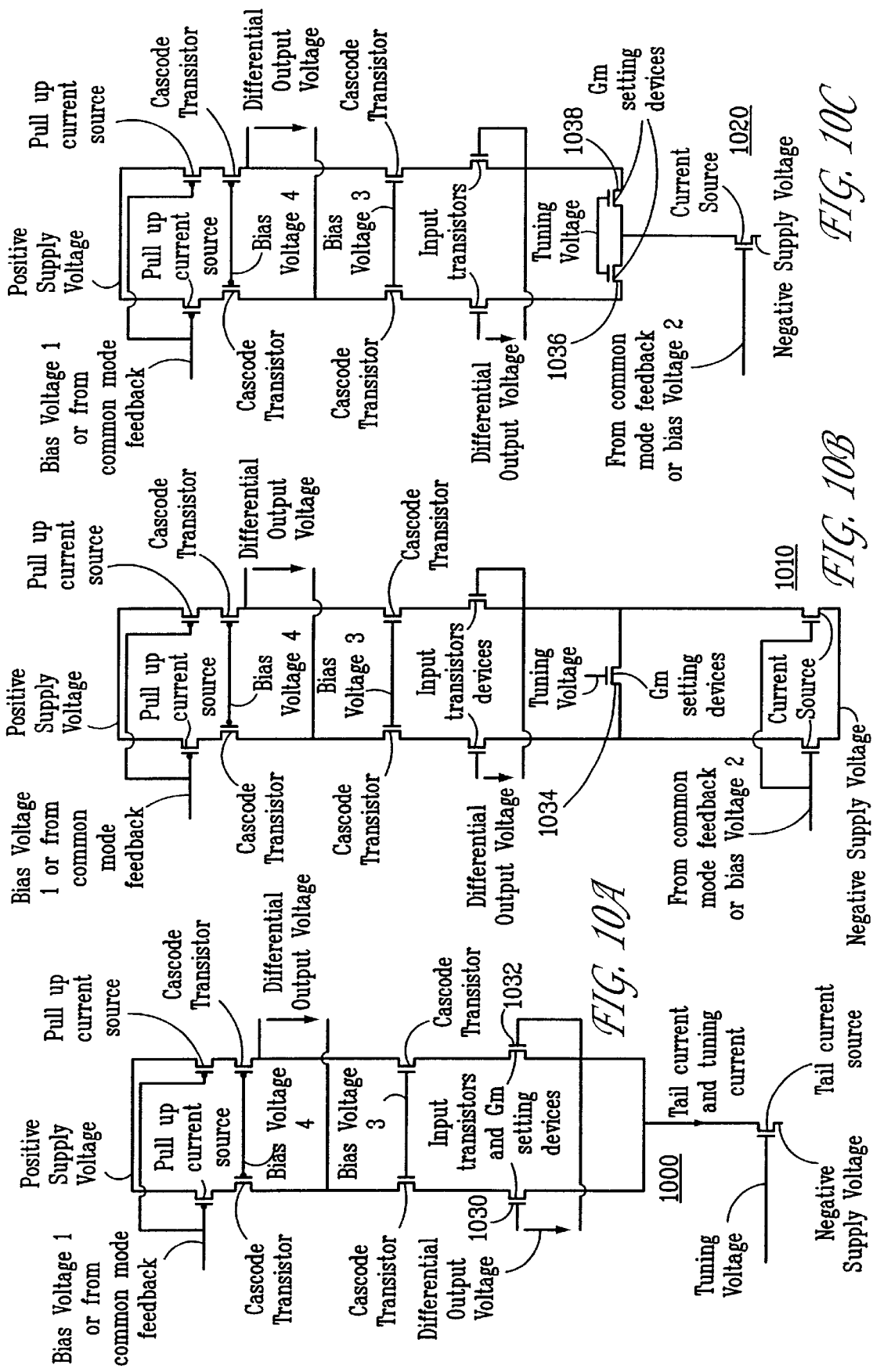

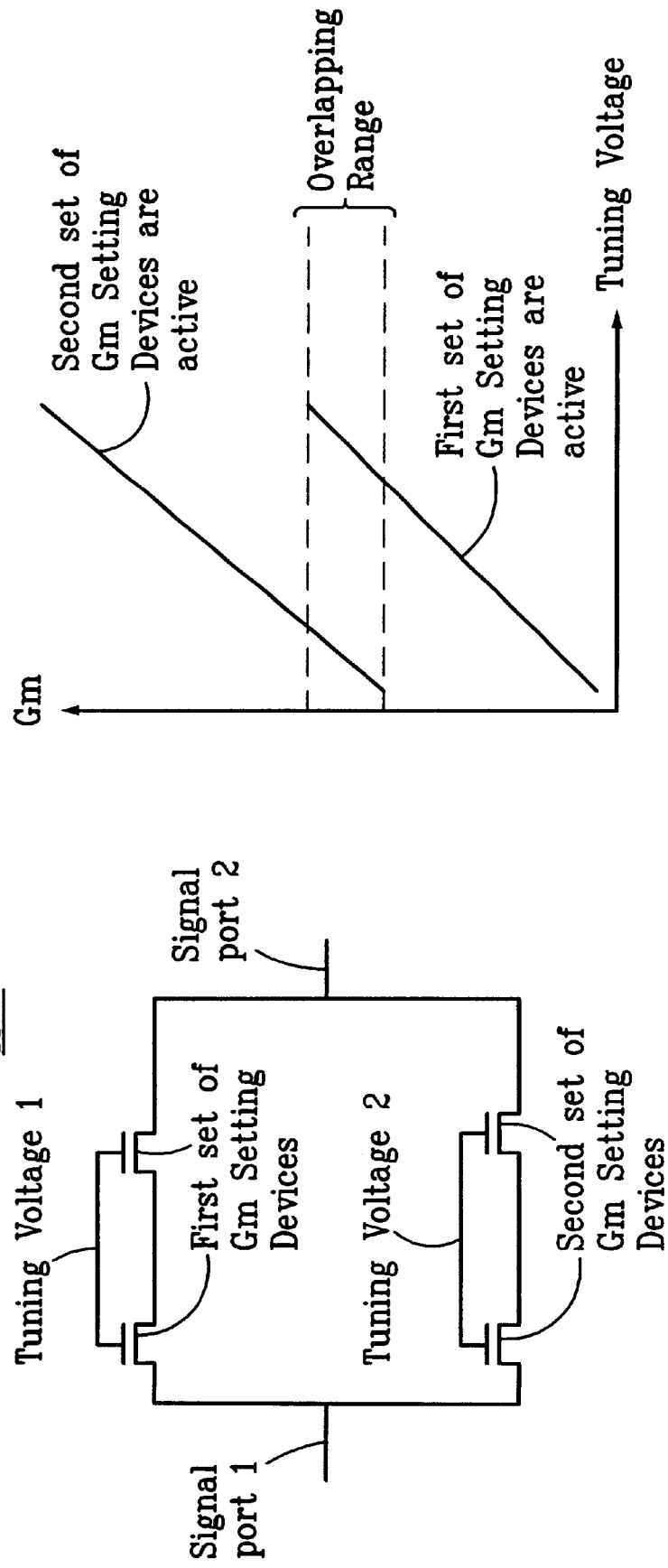

METHOD AND APPARATUS FOR AN EFFICIENT LOW VOLTAGE SWITCHABLE GM CELL

BACKGROUND

In continuous time filter and gain amplifier applications, tunable Gm cells are often used. Environmental changes and process variations are accounted for by adjusting the transconductance (Gm) of an amplifier design. This process is called tuning. Tuned amplifiers are used in read/write channels in disk drives and for audio-frequency signal processing in communication circuits. In particular, tuning enables dynamic adjustment of circuit behavior to fulfill different functions within the same circuit. Designing Gm cells with a wide tuning range and low operating voltage compatibility is a challenge in circuit design.

FIGS. 10(a), (b), and (c) show configurations of Gm cells. In these devices, the Gm cell characteristics are set by one or more Gm setting devices and a tuning voltage. As shown in FIGS. 10(a) and 10(c), two Gm setting MOS devices are used. In circuit 1000, Gm setting devices 1030 and 1032 constitute a differential transistor pair in which each receive a portion of the tail current. Here, varying the tail current sets the transconductance of the Gm cell.

In circuit 1010, a sole Gm setting device 1034 is used. Here, varying a tuning voltage sets the transconductance of the Gm cell. In circuit 1020, two Gm setting devices 1036 and 1038 are incorporated and a tuning voltage sets the transconductance of the Gm cell. In these implementations, a wide tuning range corresponds to a wide voltage range for the tuning voltage or the tail current. For low voltage designs, this may be problematic due to the limited range of operable tuning voltages or tail currents.

Other Gm cells will apply different tuning voltages to different Gm setting devices. As shown in FIG. 11(a), circuit 1100 utilizes two pairs of Gm setting devices. Consequently, two tuning voltages are applied. Circuit 1100 allows a wider variety of Gm settings to be achieved in a smaller range of tuning voltages. This method, however, creates overlapping ranges of transconductance in the operation of the Gm setting devices, as shown in FIG. 11(b). This overlapping range creates added difficulty for circuit design.

Even with the improvements of circuit 1100, there remains a limited tuning range due to limited power supply voltage available. In order to obtain a wide transconductance range, the tuning voltage of the prior art tunable cells must have a wide range. This necessary range of tuning voltages creates poor distortion behavior because of a limited ratio between gate overdrive of the Gm setting MOS device and signal swing.

SUMMARY

The present invention is defined by the following claims, and nothing in this section should be taken as a limitation on those claims. By way of introduction, the preferred embodiments described below relate to a switchable Gm cell. The Gm cell includes a plurality of Gm setting devices and a switching circuit operable to turn on and off the Gm setting devices. The switching circuit may further comprise a digital decoder. The preferred embodiments also relate to the design of Gm setting devices with differing channel widths and digital decoders operable to selectively turn on and off the Gm setting devices.

The preferred embodiments further relate to a method of driving a Gm cell utilizing a Gm setting code, decoding the Gm setting code, and turning on at least one of a plurality of Gm setting devices. Further, a tuning voltage may be altered to provide small adjustments to the overall transconductance of the Gm cell.

By incorporating a plurality of Gm setting devices, the operation of which is controlled by the use of a Gm setting code, the embodiments of the present invention enable a wide transconductance range, while allowing for a narrow tuning voltage range. In the preferred embodiments, the transconductance, Gm, of the circuit element may be applied in a linear, or stepped, manner without overlap between different voltage and/or Gm ranges. The monotone nature of the embodiments also allows for improved circuit design.

The features of the preferred embodiments are further described in the detailed description section below.

BRIEF DESCRIPTION OF THE DRAWINGS

FIGS. 10(a), (b), (c) depict prior art Gm cells.

FIG. 11(a) depicts a prior art Gm cell.

FIG. 11(b) graphically depicts the operation of a prior art Gm cell incorporating a plurality of Gm setting devices.

DETAILED DESCRIPTION OF THE PRESENTLY PREFERRED EMBODIMENTS

The embodiments described herein relate to a Gm cell utilizing digital decoding to provide a wide range of Gm values from a limited tuning voltage range. Herein, the phrase "connected with" is defined to mean directly connected to or indirectly connected with through one or more intermediate components. Such intermediate components may include both hardware and software based components. The present application has been filed currently with U.S. patent application Ser. No. 09/865,648 filed on May 25, 2001, and titled, "METHOD AND APPARATUS FOR CALIBRATING A GM CELL UTILIZING A REPLICA GM CELL," the entire disclosure of which is incorporated herein by reference.

Figure 1:
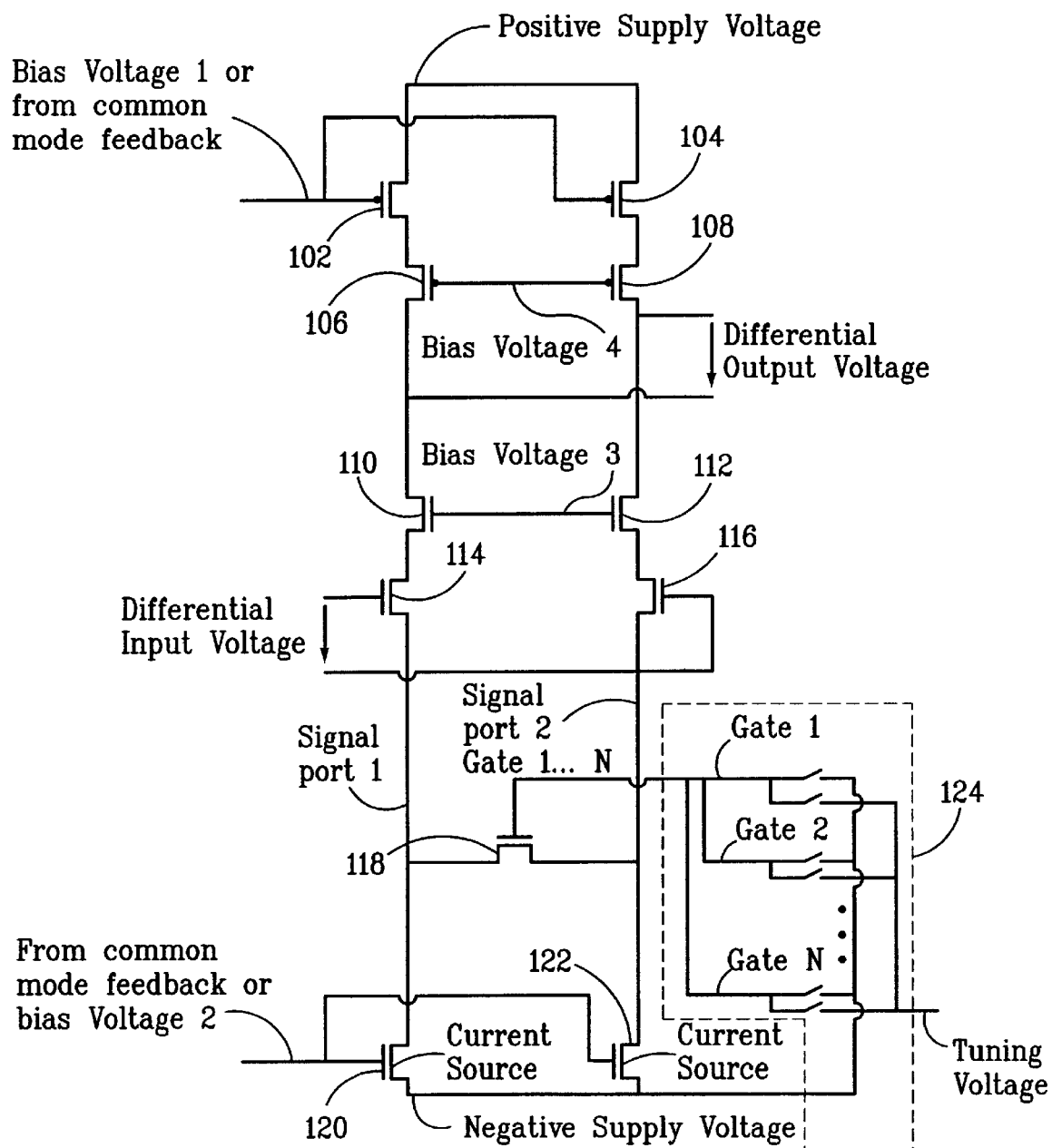
FIG. 1 depicts a circuit diagram for one embodiment of a switchable Gm cell.

FIG. 1 shows a circuit diagram of an exemplary Gm cell 100. The gates of pull up current sources 102 and 104 are connected with a bias voltage or common mode feedback circuit. The sources of the current sources 102 and 104 are tied together and connected to a positive supply voltage. The drains of the current sources 102 and 104 are connected with cascode transistors 106 and 108. A differential output voltage is generated through connection with the drains of the cascode transistors 106 and 108. In this embodiment, the current sources 102 and 104 and cascode transistors 106 and 108 are PMOS devices. In another embodiment, the current sources 102 and 104 and cascode transistors 106 and 108 may be NMOS devices. In the alternative, some of the transistors may be PMOS, while others may be NMOS.

The drains of a second pair of cascode transistors 110 and 112 are further connected to the drains of cascode transistors 106 and 108. Input transistors 114 and 116 are connected with the drains of cascode transistors 106 and 108. A differential input voltage is provided to the gates of the input transistors 114 and 116.

Next, Gm setting devices 118 are connected with the sources of the input transistors 114 and 116 and the drains of the current sources 120 and 122. The gates of the current sources 120 and 122 are connected with a bias voltage or a common mode feedback circuit. The drains of the current sources 120 and 122 are tied together and are connected with switching circuit 124, as further described below.

The overall transconductance of the circuit Gm cell is primarily adjusted by the Gm setting devices 118. The Gm setting devices 118 are a plurality of transistors with the source and drains connected together. The gates of the Gm setting devices 118 are connected through switches either to a tuning voltage, which turns the transistor on, or a low voltage, which forces the transistors to turn off. The control of which Gm setting devices are turned on or off is accomplished through switching circuit 124.

The switching circuit 124 is connected with a negative supply voltage and a tuning voltage and is operable to receive a Gm setting code. The switching circuit 124 also has a plurality of outputs, which in a preferred embodiment are equal to the number of Gm Setting devices 118. Each output of the switching circuit 124 is connected with each Gm setting device gate. The switching circuit 124 may utilize several different decoding schemes. Some methods of decoding the Gm setting input are discussed below with reference to FIGS. 3(a), (b), (c) and FIGS. 4(a), (b), (c). Further operation of an exemplary switching circuit design is discussed with reference to FIG. 5.

Figure 2:
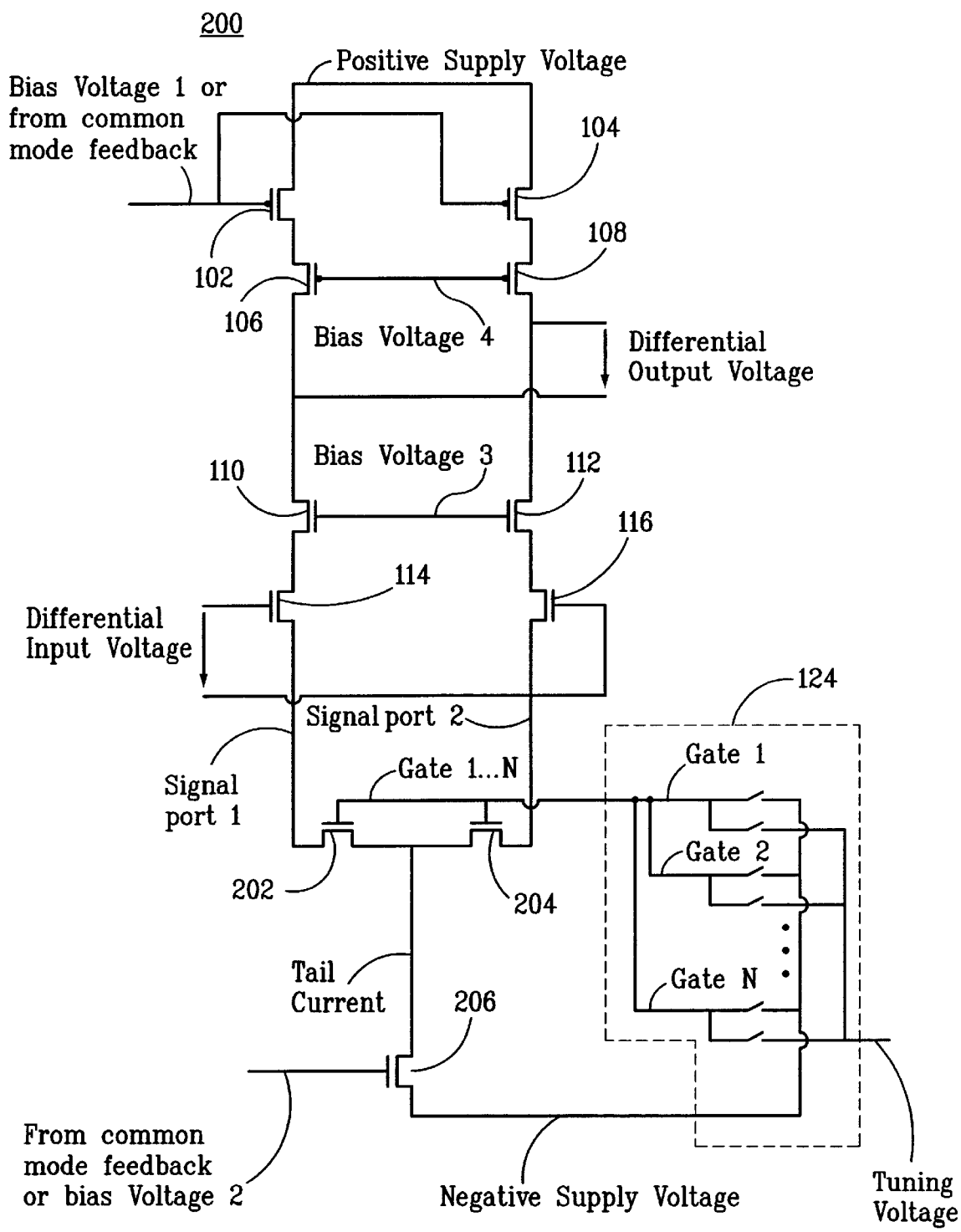
FIG. 2 depicts a circuit diagram for another embodiment of a switchable Gm cell.

Referring now to FIG. 2, another embodiment is shown. Another exemplary switchable Gm cell 200 is substantially the same as circuit 100. FIG. 2, however, utilizes pairs of Gm setting devices 202 and 204. In this embodiment, Gm setting devices 202 and 204 each operate on a portion of the tail current. The tail current is generated by tail current source 206. By utilizing pairs of Gm setting devices 202 and 204, the operating point of the MOS devices is more likely to remain in a region with linear output, which improves the Gm cell's distortion characteristics.

Figure 3A:
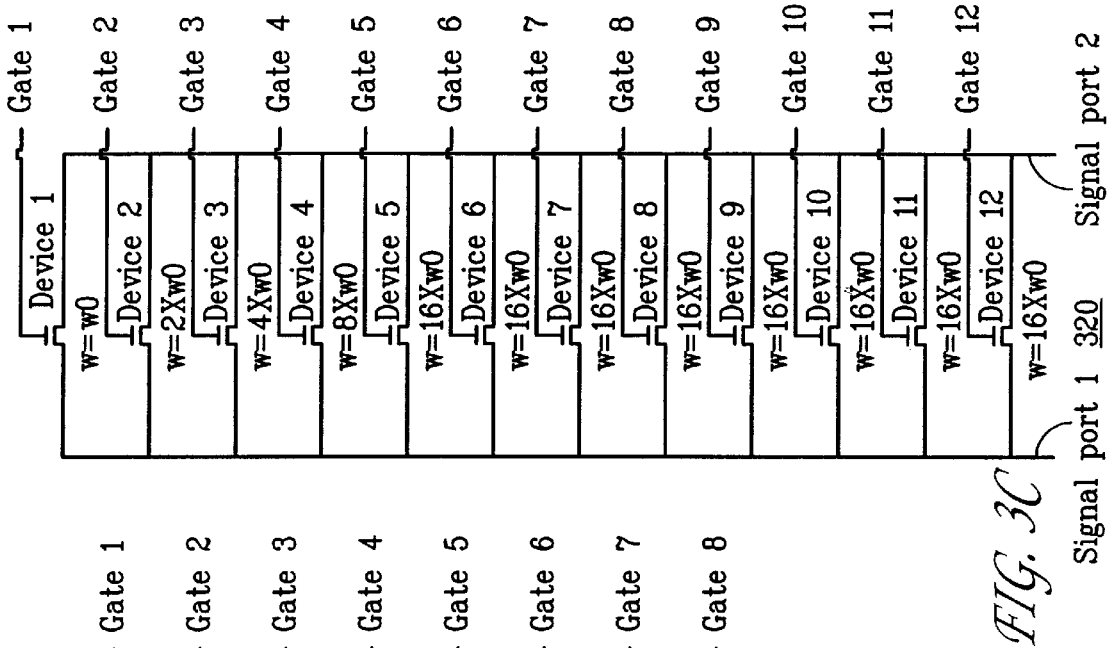
FIGS. 3(a), (b), (c) depict circuit diagrams for Gm setting devices that may be used in accordance with the embodiment depicted in FIG. 1.

FIG 3(a) shows one arrangement of Gm setting devices in accordance with the embodiment depicted in FIG. 1. Circuit 300 utilizes a thermometer-coded scheme. In circuit 300, each of the Gm setting devices has an equal channel width w0. Thus, each of the Gm setting devices has the same transconductance. For the thermometer-coded scheme of circuit 300, the switching circuit 124 is operable to turn on an additional Gm setting device for every desired increase in the Gm setting. The operation of the thermometer-coded scheme of circuit 300 may be expressed by the following equation:

Control Gate $X$=High if Gm_Setting $X \geq X$;

otherwise

Control Gate $X$=Low

If the control gate is high, the gate of the corresponding Gm setting device is switched to receive the tuning voltage. Otherwise, the gate of the corresponding Gm setting device receives the negative supply voltage. With this arrangement, each Gm increase is substantially equal.

Figure 3B:
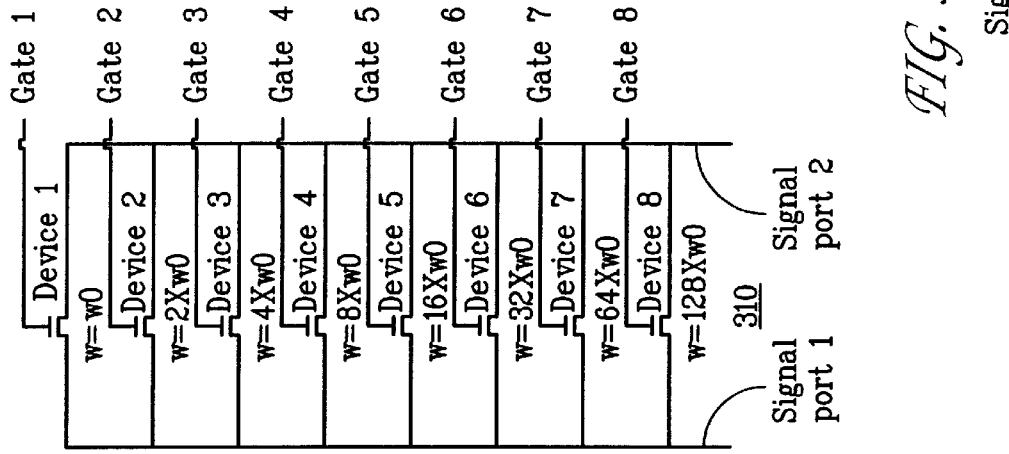

FIG. 3(b) depicts a binary code arrangement for use with the Gm cell of FIG. 1. In circuit 310, the channel widths of the Gm setting devices are weighted in accordance with the weighting of bits in a binary word. In this implementation, a smaller switching circuit 124 may be used. Further, a digital decoder is not necessary. Each Gm setting device corresponds to a bit in a binary word. For example, in an embodiment in which six Gm setting devices are used, for a Gm setting of "8", the bits 001000 would be received. Consequently, Gm setting device number 4 would be turned on, while Gm setting devices 1, 2, 3, 5, and 6 would remain off.

Figure 3C:
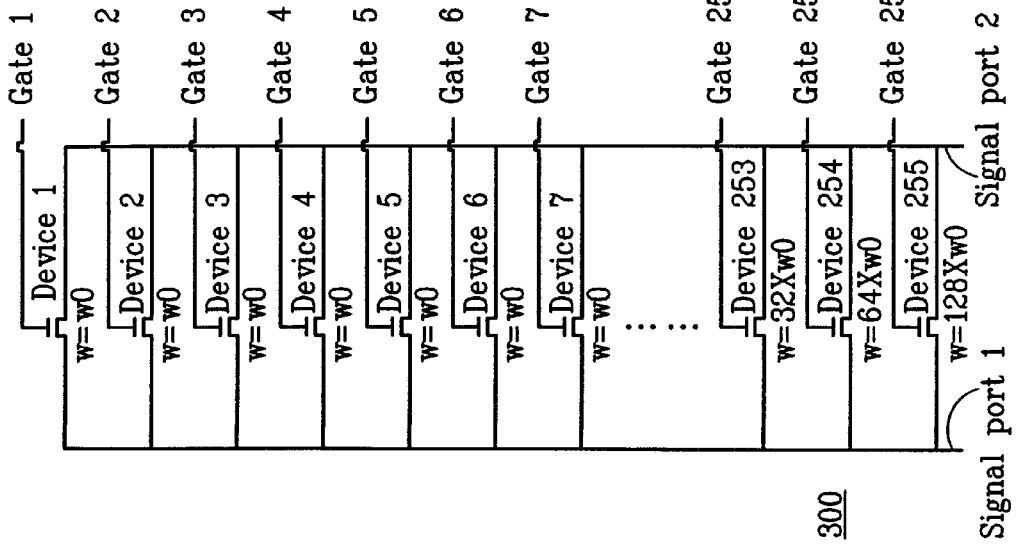

A segmented thermometer embodiment is depicted in FIG. 3(c). In circuit 320, Gate 1 has channel width w0, Gate 2 has channel width 2w0, Gate 3 has channel width 4w0, Gate 4 has channel width 8w0, and Gates 5–12 have a channel width 16w0. In a preferred embodiment, w0 is 0.41 $\mu$m. This implementation provides benefits of both the themometer-coded and binary coded implementations. Here, the decoder size is reduced and the use of multiple setting devices with equal channel widths increase the accuracy of voltage increases. Control of the segmented thermometer coding method can be described as:

For $0 < X < 4$,

Control Gate $X$ = Gm_Setting $X$

For $X > 3$ and the integer value of $\dfrac{\text{Gm\_Setting}X}{16} > (X-3)$,

Control Gate $X$ = High

Figure 4A:
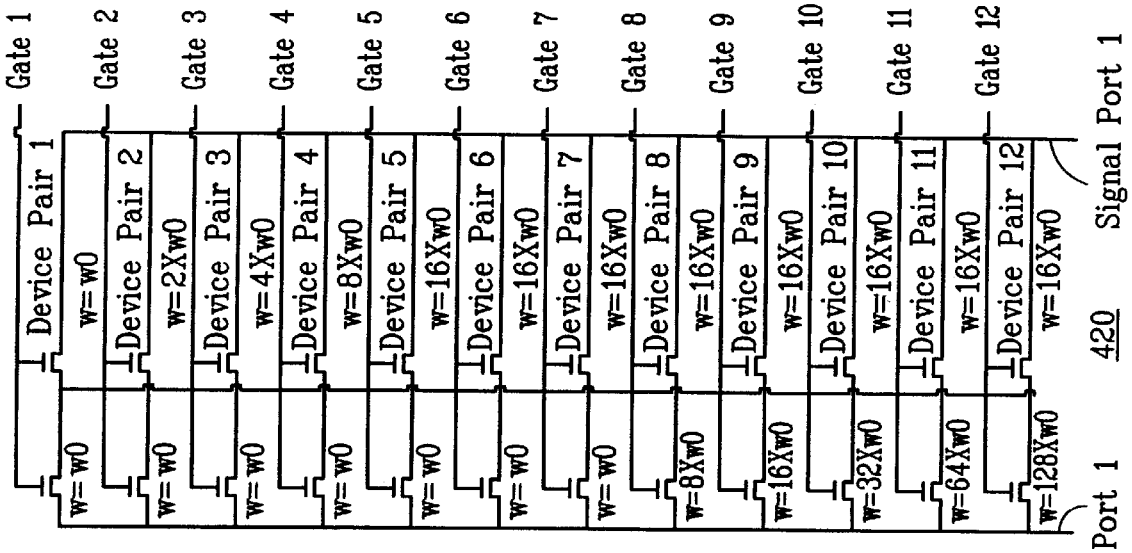
FIGS. 4(a), (b), (c) depict circuit diagrams for Gm setting devices that may be used in accordance with the embodiment depicted in FIG. 2.

For $X > 3$ and the integer value of $\dfrac{\text{Gm\_Setting}X}{16} \leq (X-3)$, Control Gate $X$ = Low Referring now to FIGS. 4(a), (b), (c), circuits 400, 410, and 420 depict thermometer coded, binary coded. and segmented thermometer coded arrangements, respectively, for circuit 200 of FIG. 2. The operation of the devices is the same as discussed above for FIGS. 3(a), (b), and (c), with the exception that pairs of transistors are utilized and the gates of the pairs of transistors are tied together.

Figure 5:
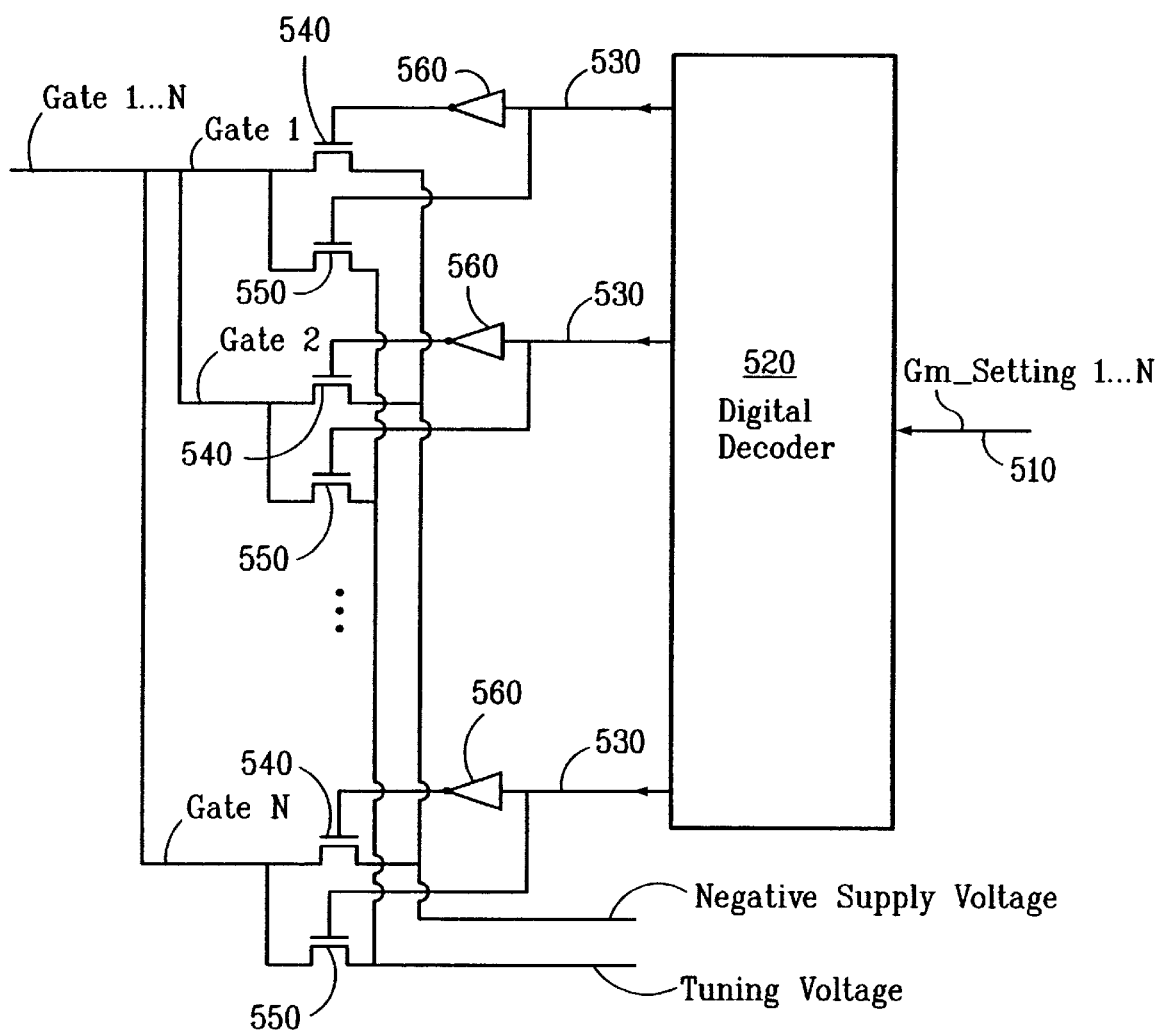
FIG. 5 depicts a switching circuit that may be used in accordance with various embodiments of a switchable Gm cell.

Referring now to FIG. 5, an exemplary switching circuit 500 is shown. Gm_Setting input 510 is connected with a digital decoder 520. The digital decoder 520 receives a desired Gm setting and outputs a high or low voltage signal to the control gates 530. The operation of the digital decoder 520 is dependent on the decoding scheme utilized. As discussed above, the decoding scheme may take a variety of arrangements, including thermometer coding, binary coding, and segmented thermometer coding. Additionally, other decoding schemes may be utilized depending on design preference.

The control gates 530 connected with the outputs of the digital decoder 520 are operable to control which Gm setting devices are turned on. Each control gate 530 comprises a pair of NMOS transistors 540 and 550 and an inverter 560. The gate of the first NMOS transistor 540 is connected with the output of the inverter 560. The gate of the second MOS transistor 550 is connected with an output of the digital decoder 520. The source of the first NMOS transistor 540 is connected with the negative supply voltage. The drain of the second NMOS transistor 550 is connected with the tuning voltage. The sources of the first NMOS transistor 540 and second NMOS transistor 550 are tied together and are connected with the gates of each Gm setting device.

When a high voltage signal is outputted from the digital decoder, the inverter 560 inverts the signal such that a low voltage signal is applied to the gate of the first NMOS transistor, which, in turn, turns off the first NMOS transistor 540. At the same time, the high voltage signal outputted from the digital decoder is applied to the gate of the second NMOS transistor 550, thereby turning the transistor on. The tuning voltage is applied to the drain of the second transistor 550 and the source yields a voltage, which when applied to the gate of a Gm setting device is sufficient to turn on the Gm setting device.

Conversely, when a low voltage signal is outputted from the digital decoder 520, the inverter 560 inverts the signal such that a high voltage signal is applied to the gate of the first NMOS transistor 540, which, in turn, turns on the first NMOS transistor 540. A negative supply voltage is then applied to the source of the first NMOS transistor 540. The drain of the first NMOS transistor 540, applies a negative voltage to the gate of the Gm setting device that ensures that the Gm setting device is off. At the same time, the low voltage is applied to the second NMOS transistor 550. This voltage, however, is insufficient to turn on the second NMOS transistor 550. Thus, the Gm setting device remains off.

Various other implementations for the switching circuit 500 may be utilized. For example, PMOS or a combination of PMOS and NMOS devices may be used. Moreover, the control gates 530 and transistors 540 and 550 operate as a multiplexer. Thus, switching circuit 500 may be constructed by connecting a multiplexer with a digital decoder. For certain decoding schemes, such as the binary coded arrangements of FIGS. 3(*b*) and 4(*b*), a digital decoder is not necessary. Further, other embodiments of the switching circuit 500 may utilize BJT transistors, a plurality of inventors for each gate, or forms of digital logic, such as AND, NAND, NOR, or OR gates. The internal operation of the switching circuit 500 is a matter of design preference dependent on the decoding scheme utilized.

Figure 6:
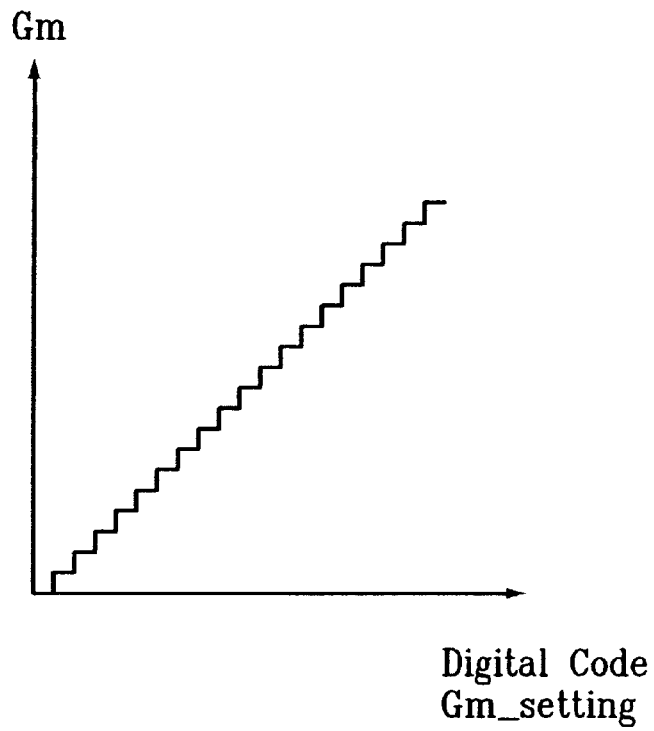
FIG. 6 graphically represents the transconductance yielded with respect to a digital Gm setting in accordance with one embodiment of a Gm cell wherein the tuning voltage is held constant.

By utilizing a binary code to implement the Gm setting, the Gm value of the Gm setting device operates in a discrete, linear manner. As shown in FIG. 6, a Gm value steps up for every increase in the Digital Code Gm_setting where the tuning voltage is held constant. Environmental changes, such as, temperature changes, power supply changes, or variations in manufacturing processes can be accounted for by adjusting the tuning voltage. In this manner, the tuning voltage operates as a "fine adjustment" for the Gm of the cell, where the Gm setting devices are used for "coarse adjustments."

Figure 7:
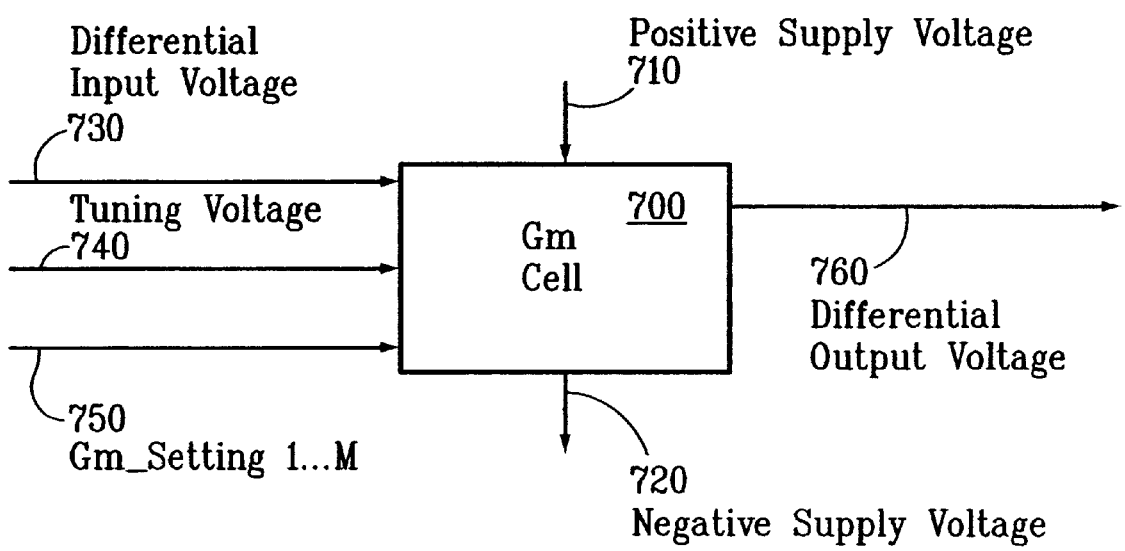
FIG. 7 depicts an overall block diagram of one embodiment of a switchable Gm cell.

Referring now to FIG. 7, a block diagram for an Gm cell using an embodiment of the present invention is depicted. The Gm cell 700 is connected with a positive supply voltage 710 and a negative supply voltage 720. The Gm cell has a differential input voltage input 730, tuning voltage input 740, a Gm setting input 750, and a differential output voltage output 760. The Gm cell 700 utilizing an embodiment of the present invention may obtain a wider transconductance range with a smaller tuning voltage range. By incorporating a Gm setting and Gm setting devices into the Gm cell 700, the large, or "coarse" adjustments to the overall transconductance of the Gm cell may be accomplished by inputting a different Gm setting. Meanwhile, small, or "fine" adjustments may be accomplished by adjusting the tuning voltage.

Figure 4B:
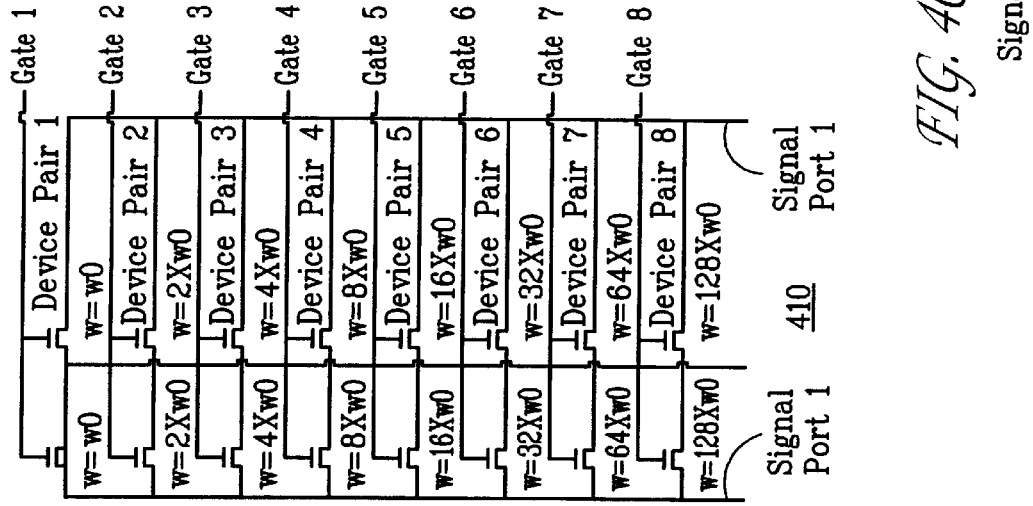
Figure 4C:
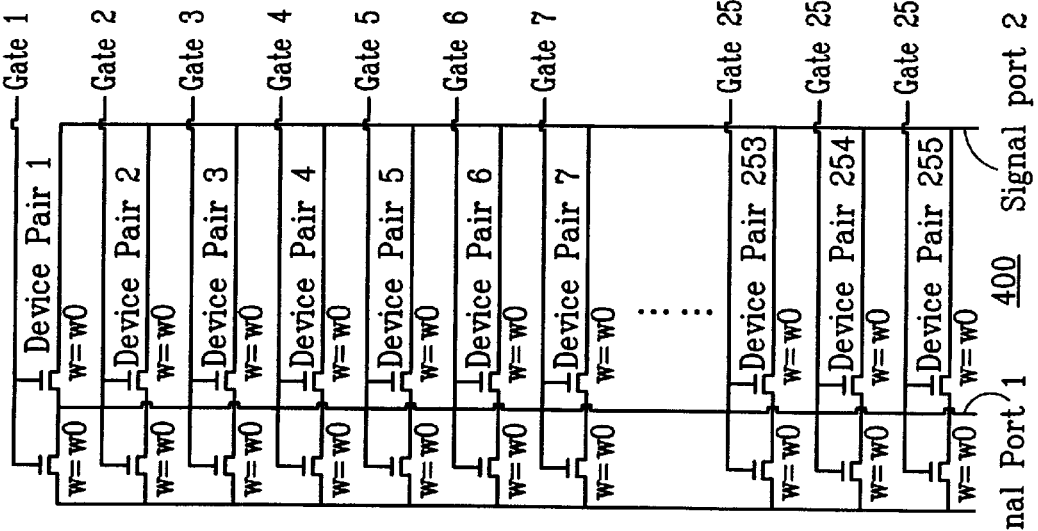
Figure 8:
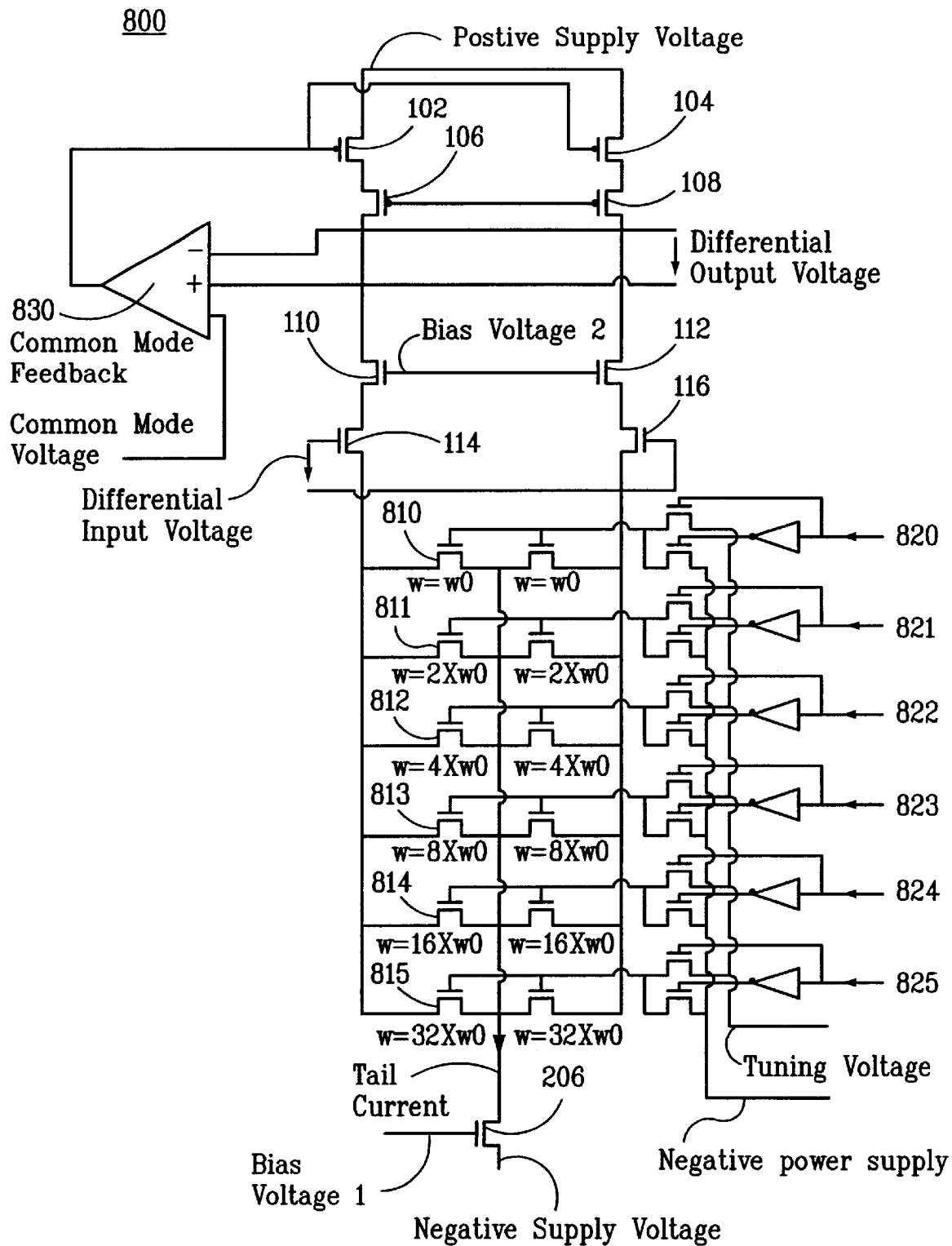
FIG. 8 depicts one embodiment in which an exemplary switchable Gm cell with binary coded Gm setting devices and a common mode feedback circuit are incorporated.

FIG. 8 shows an exemplary switched Gm cell with binary coded Gm setting devices and a common mode feedback circuit. The circuit 800 applies an operational structure similar to the arrangements depicted in FIGS. 2, 4(*b*), and 5. This Gm cell applies 6 pairs of Gm setting devices 810–815 each of which is driven by a bit of a binary word that corresponds to the Gm setting. Because binary coding is utilized, the switching circuitry required is minimized. In this case, the individual bits of the binary word may be directed to the control gates 820–825 without the use of a digital decoder 520. Because a binary decoding method is applied in this circuit, the channel widths of the MOS devices double to accommodate the least significant to most significant relationship of binary bits. Thus, the channel widths are w0, 2w0, 4w0, 8w0, 16w0, and 32w0, which represent the weighting of a 6 bit binary word from least to most significant bit.

Additionally present in FIG. 8 is an error amplifier 830 as an element in the common mode feedback loop. Here, the differential output voltage is applied to the inputs of the comparator 830 which applies the difference of the two voltages to the gates of the pull-up current sources 102 and 104.

Figure 9A:
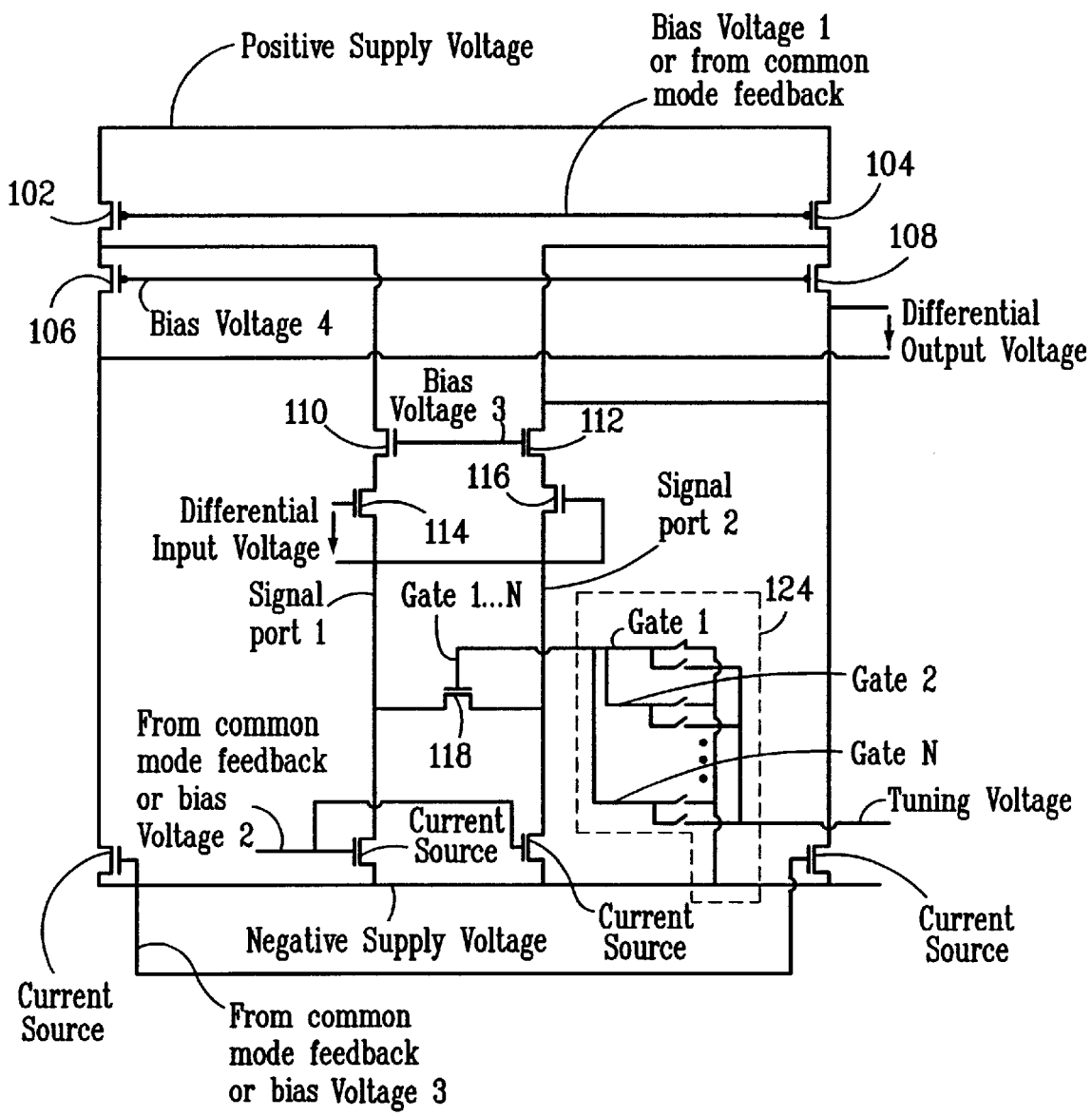
FIGS. 9(a) and (b) depict embodiments of switchable Gm cells incorporating a folded cascode arrangement.
Figure 9B:
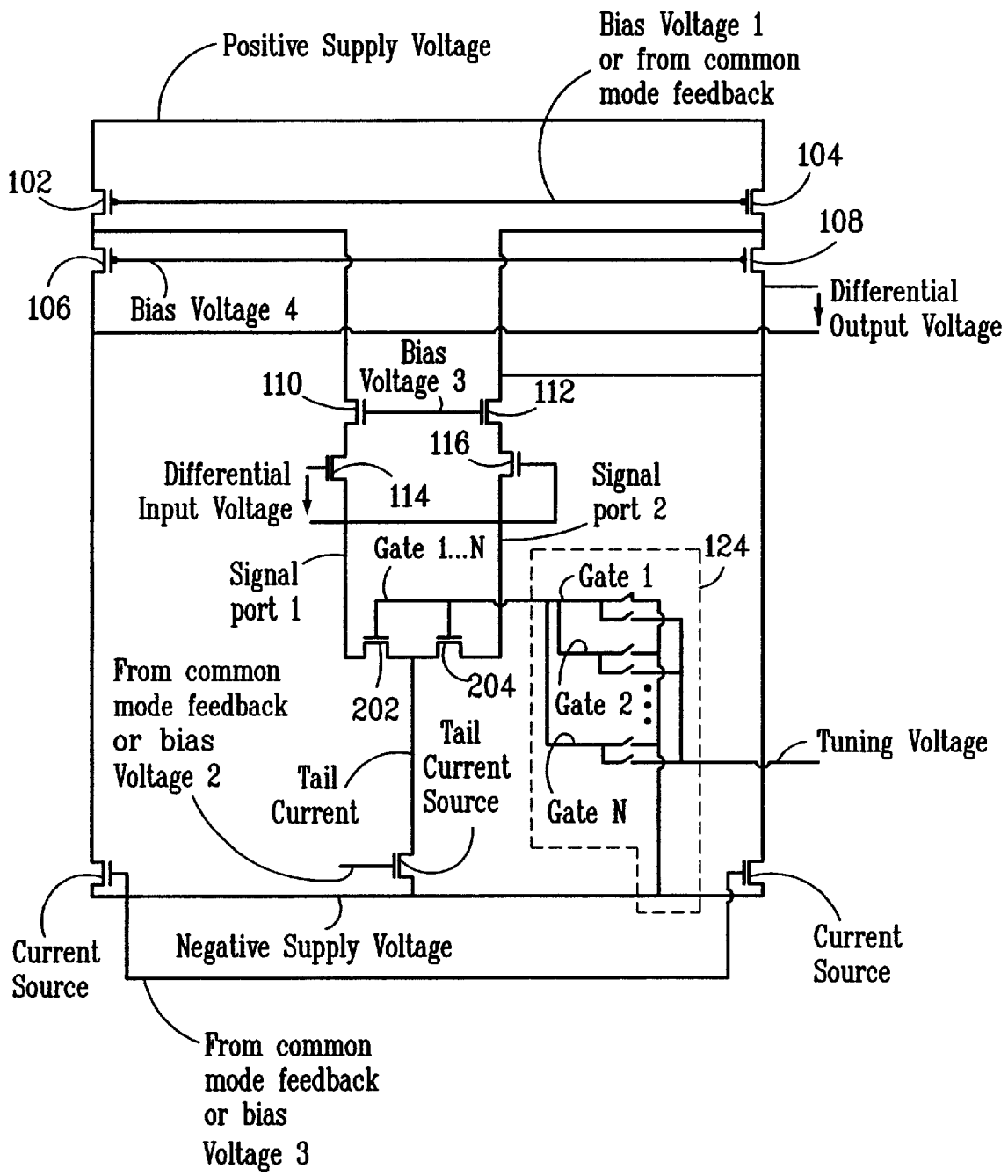

Referring now to FIGS. 9(*a*) and (*b*), embodiments utilizing a folded cascade arrangements are depicted. Circuit 900 is a folded cascode version of the telescopic configuration depicted in circuit 100 (FIG. 1). Circuit 910 is a folded cascade version of the telescopic configuration depicted in circuit 200 (FIG. 2). In circuits 100 and 200, the drains of the NMOS cascode transistors 110 and 112 are connected with the drains of the PMOS cascode transistors 106 and 108. In circuits 900 and 920, the drains of the NMOS cascode transistors 110 and 112 are connected to the sources of the PMOS cascode transistors 106 and 108. As result, circuits 900 and 910 are operable with a lower power supply voltage. Additionally, the folded cascode circuits 900 and 910 support lower cutoff frequencies and lower output common mode voltages.

It is to be understood that a wide range of changes and modifications to the embodiments described above will be apparent to those skilled in the art and are contemplated. It is therefore intended that the foregoing detailed description be regarded as illustrative, rather than limiting, and that it be understood that it is the following claims, including all equivalents, that are intended to define the spirit and scope of the invention.

I claim:

1. A switching Gm cell comprising:
    a plurality of Gm setting devices, each of said Gm setting devices comprising at least one transistor;
    a switching circuit connected with said Gm setting devices and operable to receive a Gm setting code and provide a voltage to said Gm setting devices.

2. The Gm cell of claim 1 wherein said Gm setting devices have equal channel widths.

3. The Gm cell of claim 1 wherein at least one of said Gm setting devices has a different channel width.

4. The Gm cell of claim 1 wherein said plurality of Gm setting devices are thermometer coded.

5. The Gm cell of claim 1 wherein said plurality of Gm setting devices are binary coded.

6. The Gm cell of claim 1 wherein said plurality of Gm setting devices are segmented thermometer coded.

7. The Gm cell of claim 1 wherein said plurality of Gm setting devices comprise a plurality of pairs of transistors connected with an output of said switching circuit.

8. The Gm cell of claim 1 wherein said switching circuit comprises:

a digital decoder; and a multiplexer connected with said digital decoder.

9. The Gm cell of claim 1 wherein said switching circuit comprises:

a digital decoder;

a plurality of first transistors connected with said digital decoder, a tuning voltage, and said Gm setting devices;

a plurality of inverters connected with said digital decoder; and a plurality of second transistors connected with said plurality of inventors, a negative supply voltage, and said Gm setting devices.

10. A switching Gm cell comprising:

a plurality of Gm setting devices;

a switching circuit connected with said Cm setting devices and operable to receive a Gm setting code and turn on at least one of said plurality of Gm setting devices;

a first pair of current source transistors connected with said Gm setting devices;

a pair of input transistors connected with said Gm setting devices;

a first pair of cascode transistors connected with said first pair of input transistors;

a second pair of cascode transistors connected with said first pair of cascode transistors; and a second pair of current source transistors connected with said second pair of cascode transistors.

11. A method of driving a Gm cell comprising the acts of:

providing a plurality of Gm setting devices;

receiving a Gm setting code;

decoding said Gm setting code;

turning on at least one of said Gm setting devices in accordance with said Gm setting code.

12. The method of claim 11 further comprising the act of further adjusting the transconductance of said Gm cell by altering a tuning voltage.

13. The method of claim 11 wherein said Gm setting code is a binary word.

* * * * *

UNITED STATES PATENT AND TRADEMARK OFFICE
CERTIFICATE OF CORRECTION

PATENT NO.    : 6,480,064 B1
DATED         : November 12, 2002
INVENTOR(S)   : Sasan Cyrusian It is certified that error appears in the above-identified patent and that said Letters Patent is hereby corrected as shown below:

Column 7,
Line 24, delete "Cm" and substitute -- Gm -- in its place.

Signed and Sealed this

Eighth Day of July, 2003

JAMES E. ROGAN
*Director of the United States Patent and Trademark Office*